US011695342B2

(12) United States Patent
Jodka

(10) Patent No.: US 11,695,342 B2
(45) Date of Patent: Jul. 4, 2023

(54) ACTIVE PULL-UP AND LEVEL SHIFTER CIRCUIT

(71) Applicant: Dialog Semiconductor (UK) Limited, London (GB)

(72) Inventor: Eduardas Jodka, Freising (DE)

(73) Assignee: Dialog Semiconductor (UK) Limited, London (GB)

( * ) Notice: Subject to any disclaimer, the term of this patent is extended or adjusted under 35 U.S.C. 154(b) by 188 days.

(21) Appl. No.: 17/376,929

(22) Filed: Jul. 15, 2021

(65) Prior Publication Data

US 2023/0015995 A1    Jan. 19, 2023

(51) Int. Cl.
 *H02M 3/335*  (2006.01)
 *H02M 1/08*  (2006.01)

(52) U.S. Cl.
 CPC ............ *H02M 3/335* (2013.01); *H02M 1/08* (2013.01)

(58) Field of Classification Search
 CPC ................................ H02M 1/08; H02M 3/335
 See application file for complete search history.

(56) References Cited

U.S. PATENT DOCUMENTS 10,498,315 B2 * 12/2019 Jodka ............ H03K 19/018507
10,693,460 B1   6/2020 Takahashi et al.
10,916,653 B2 *  2/2021 Assaad ............... H01L 29/7835
11,196,418 B1  12/2021 Suryanarayana et al.
11,563,378 B2 *  1/2023 Becker .................... H02M 1/14
2012/0075001 A1 *  3/2012 Sumitomo ..... H03K 19/018521
                                                    327/333
2013/0335152 A1  12/2013 Burnette et al.
2014/0333365 A1 * 11/2014 Takahashi ...... H03K 19/018507
                                                    327/333

OTHER PUBLICATIONS

German Office Action, File No. 10 2021, 119 831.3, Applicant: Dialog Semiconductor (UK) Limited, dated May 20, 2022, 10 pages.
"A Tri-Slope Gate Driving GaN DC-DC Converter With Spurious Noise Compression and Ringing Suppression for Automotive Applications," by Xugang KE et al., IEEE Journal of Solid-State Circuits, vol. 53, No. 1, Jan. 2018, pp. 247-260.

* cited by examiner

*Primary Examiner* — Kyle J Moody
(74) *Attorney, Agent, or Firm* — Saile Ackerman LLC; Stephen B. Ackerman

(57) ABSTRACT

An active pull-up circuit which is operated between an upper voltage and a lower voltage and which pulls up an intermediate node to the upper voltage in reaction to an input voltage of the pull-up circuit falling from the upper voltage to an intermediate voltage is described. The pull-up circuit comprises a first transistor having a source terminal coupled to the upper voltage, a drain terminal coupled to the intermediate node and a gate terminal coupled to the input voltage. The pull-up circuit comprises a second transistor having a source terminal coupled to the upper voltage, a drain terminal coupled to the intermediate node and a gate terminal coupled to a control node. In addition, the pull-up circuit comprises control circuitry configured to pull the control node to a voltage level of the intermediate node, subject to the input voltage falling from the upper voltage to the intermediate voltage.

15 Claims, 7 Drawing Sheets

ACTIVE PULL-UP AND LEVEL SHIFTER CIRCUIT

TECHNICAL FIELD

The present document relates to an enhanced active pull-up circuit, in particular for use within a level-shifter circuit.

BACKGROUND

A pull-up circuit may be used within a level-shifter circuit which is configured to shift a control voltage for controlling a power switch from an input level to an output level. The present document is directed at the technical problem of increasing the reliability of a pull-up circuit, notably for increasing the reliability of a level-shifter circuit which comprises the pull-up circuit.

SUMMARY

According to an aspect, an active pull-up circuit which is operated between an upper voltage and a lower voltage and which is configured to pull-up an intermediate node to the upper voltage in reaction to an input voltage of the pull-up circuit falling from the upper voltage to an intermediate voltage is described.

The pull-up circuit comprises a first transistor, in particular a P-type transistor, having a source terminal coupled to the upper voltage, a drain terminal coupled to the intermediate node and a gate terminal coupled to the input voltage. Furthermore, the pull-up circuit comprises a second transistor, in particular a P-type transistor, having a source terminal coupled to the upper voltage, a drain terminal coupled to the intermediate node and a gate terminal coupled to a control node. In addition, the pull-up circuit comprises control circuitry configured to pull the control node to the voltage level of the intermediate node, subject to the input voltage falling from the upper voltage to the intermediate voltage.

According to a further aspect, a level-shifter circuit configured to translate a change of the level of an input voltage within an input voltage domain into a change of the level of an output signal within an output voltage domain is described (e.g., for use within a DC/DC power converter). The level-shifter circuit comprises a first pull-up circuit as described in the present document. Furthermore, the level-shifter circuit comprises an output circuit operated between an upper voltage of the output voltage domain and the lower voltage of the output voltage domain. The first pull-up circuit is configured to pull-up the intermediate node of the first pull-up circuit to the upper voltage of the input voltage domain, subject to the input voltage falling from the upper voltage of the input voltage domain to the lower voltage of the input voltage domain. The output circuit is configured to change the level of the output signal at an output node of the level-shifter circuit, subject to the intermediate node of the first pull-up circuit being pulled-up to the upper voltage of the input voltage domain.

According to another aspect, a method for operating a pull-up circuit and/or a level-shifter circuit and/or a power controller as outlined on the present document is described.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF DRAWINGS

The invention is explained below in an exemplary manner with reference to the accompanying drawings, wherein.

DESCRIPTION

Figure 1:
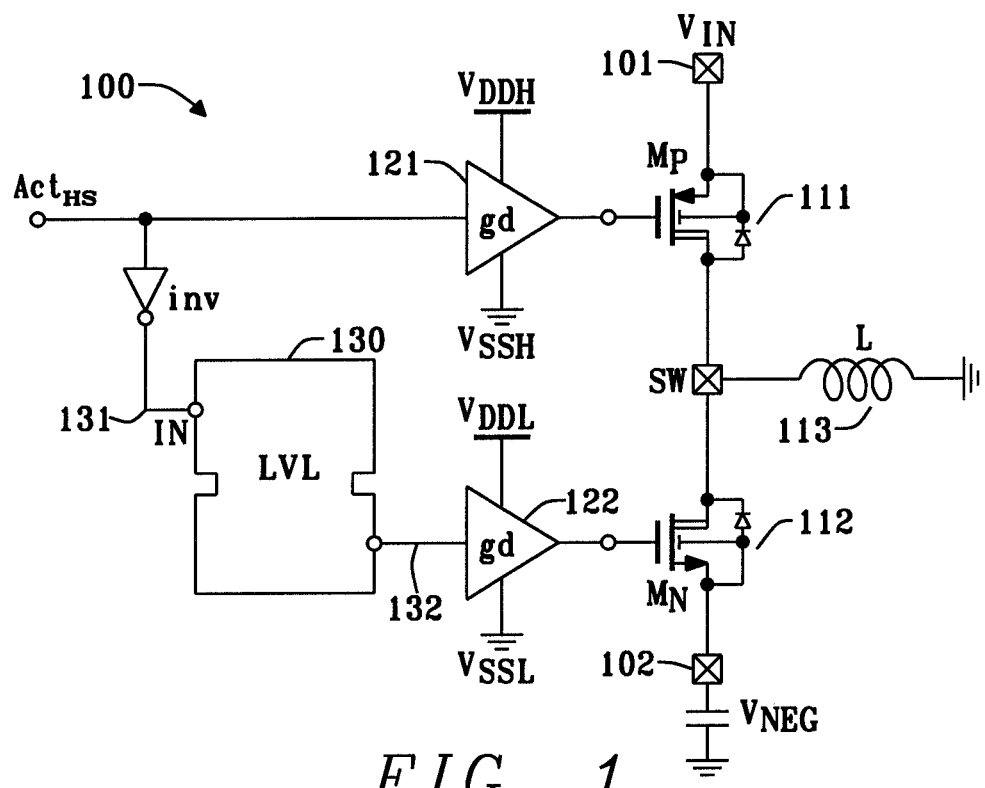
FIG. 1 shows a circuit diagram of an example switched power converter for providing a negative output voltage.

As indicated above, the present document is directed at improving the performance and/or at increasing the reliability of an active pull-up circuit, in particular when operated within a level-shifter circuit. In this context FIG. 1 shows an example DC/DC converter 100 configured as a negative Buck-Boost converter. The supply or input voltage 101 is denoted as $V_{IN}$ and the regulated negative output voltage 102 is denoted as $V_{NEG}$. Regulation is achieved via duty-cycled operation of the power stage which comprises the low-side power switch 112, notably FET (field effect transistor), $M_N$ and the high-side power switch 111, notably FET, $M_P$. The power switches 111, 112 are controlled via gate drivers 121, 122 (denoted as 'gd'). The low-side gate driver 122 operates at a supply voltage range between $V_{DDL}$ and $V_{SSL}$. The high-side gate driver 121 operates at a supply voltage range between $V_{DDH}$ and $V_{SSH}$. Conversion from the higher supply voltage domain (i.e., the input voltage 131) to the lower supply voltage domain (i.e., the output voltage 132) is performed by the level shifter circuit 130 'LVL'.

The two supply voltage domains of the low-side driver 122 ($V_{DDL}$ and $V_{SSL}$) and of the high-side driver 121 ($V_{DDH}$ and $V_{SSH}$) may be completely independent from each other and may have a relatively large supply voltage range difference. In a quantitative example the following values may apply:

$V_{DDH}$ may be equal to the input voltage 131 $V_{IN}$ and may vary in a typical range of 2V-5V, with $V_{SSH}$ being the nominal ground 0V;

$V_{DDL}$ may be an internally generated supply voltage for supplying the low-side gate driver 122 relative to the voltage $V_{SSL}$ which may take on the value of the regulated negative output voltage 102 $V_{SSL}=V_{NEG}=-7V$ (example output voltage target). As a result of this, the supply voltage may be $V_{DDL}=V_{SSL}+5V=-7V+5V=-2V$ (assuming a 5V headroom).

As it is suggested by the above-mentioned values, a level-shifter circuit 130 which converts a control signal 131 from the higher supply domain down to a lower supply domain (comprising voltage values below the voltage values of the higher supply domain) may be exposed to an overall absolute voltage difference of $V_{DDH}-V_{SSL}=5V+7V)=12V$, which imposes a relatively high-voltage capability requirement on the level-shifter circuit 130.

In addition to the above-given requirements, a level-shifter circuit 130 which operates in the technical environment of FIG. 1 typically needs to meet the following requirements:

the level-shifter circuit 130 should not have any static current consumption, in order to allow for an efficient operation;

the propagation delay time of the level-shifter circuit 130 should be as low as possible, in order to allow for a relatively high switching speed of the power converter 100; and/or the level-shifter circuit 130 should cover a relatively small area.

Figure 2A:
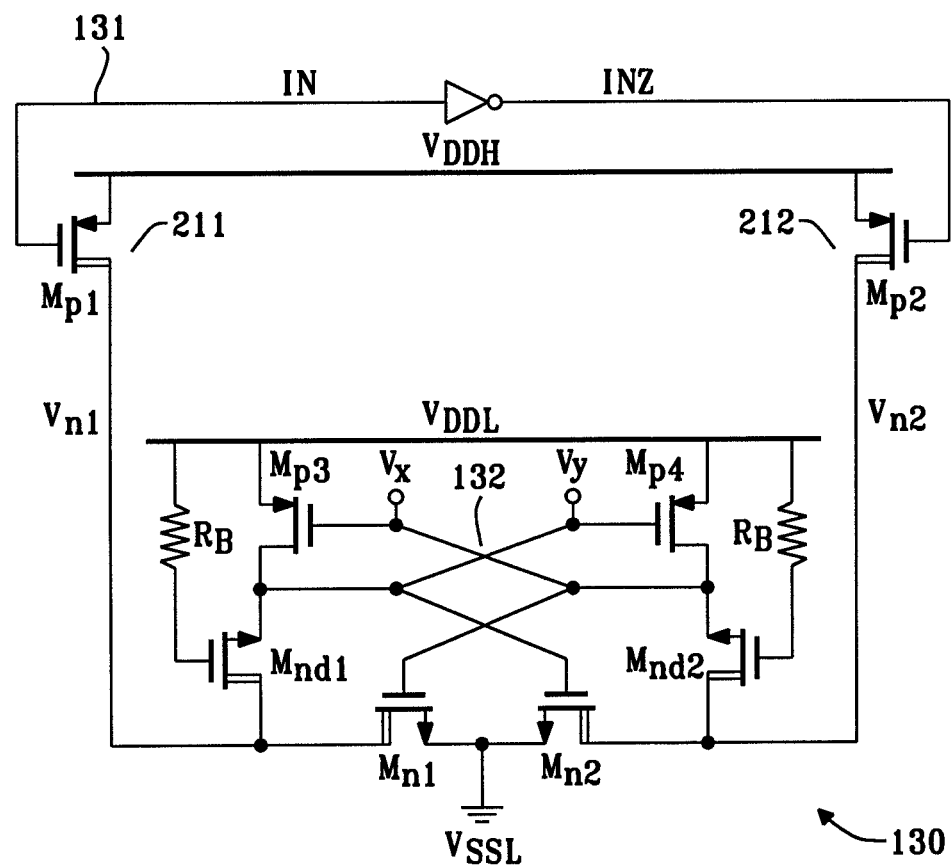
FIG. 2A shows a circuit diagram of an example level-shifter circuit.

FIG. 2A shows a circuit diagram of an example level-shifter circuit 130 which is configured to convert an input signal 131 from an upper supply domain to a lower supply domain (thereby providing an output signal 132).

The different components of the level-shifter circuit 130 of FIG. 2a serve the following function:

the transistors 211 $M_{p1}$ and 212 $M_{p2}$ may be relatively high-voltage PMOS type transistors (e.g., with a capability of withstanding voltage drops of up to 12V).

The transistors are typically relatively large to ensure a reliable level tripping; the transistors $M_{nd1}$ and $M_{nd2}$ may be relatively high-voltage NMOS type transistors (e.g., with a capability of withstanding voltage drops of up to 12V). The transistors are typically relatively large to provide clamping of the $V_x/V_y$ signals (which provide the differential output signal 132);

the transistors $M_{n1}$ and $M_{n2}$ may be relatively high-voltage NMOS type transistors (e.g., with a capability of withstanding voltage drops of up to 12V). The transistors are typically relatively small devices forming a latch in the lower supply domain;

the transistors $M_{p3}$ and $M_{p4}$ may be 5V PMOS type transistors. The transistors are typically relatively small devices forming a latch in the lower supply domain; and/or $R_B$ may be biasing resistors which are configured to decouple high-frequency noise. $R_B$ may be in a range of 5Ω.

Figure 2B:
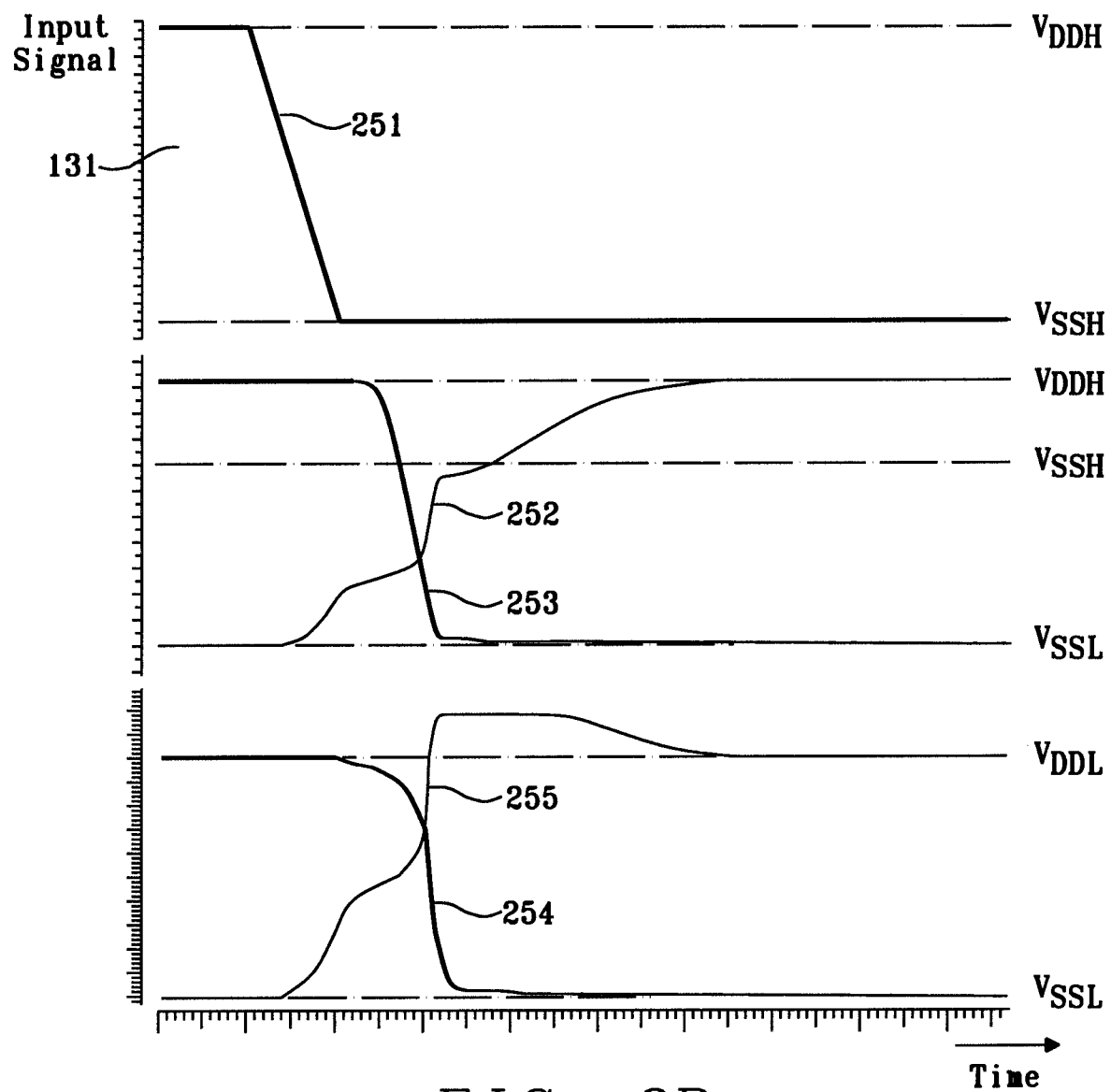
FIG. 2B illustrates example voltage signals subject to a change of the level of the input voltage of the level shifter circuit.

Typical waveforms illustrating the operation of the level-shifter circuit 130 of FIG. 2A are shown in FIG. 2B. The transition cycle starts with the input signal 131 IN going down from $V_{DDH}$ to $V_{SSH}$ (waveform 251). In reaction to this, the device 211 $M_{p1}$ gets turned on and pulls the intermediate node $V_{n1}$ from $V_{SSL}$ to $V_{DDH}$ (waveform 252). As the intermediate node $V_{n1}$ starts moving up, the PMOS device $M_{p4}$ turns off and the NMOS device $M_{n2}$ turns on to pull the intermediate node $V_{n2}$ down (waveform 253). At the same time the internal node $V_x$ of the latched structure gets pulled down by $M_{n2}$ through the clamping device $M_{nd2}$ (waveform 254). As the node $V_x$ moves from $V_{DDL}$ to $V_{SSL}$, the PMOS device $M_{p3}$ turns fully on to bring the internal node $V_y$ of the latched structure up (waveform 255), thereby completing the transition cycle.

The capability of the level-shifter circuit 130 to change its logic state (i.e., switching from high to low, or from low to high) typically depends on the ability of the input PMOS device pair 211, 212 $M_{p1}/M_{p2}$ to pull up the intermediate nodes $V_{n1}/V_{n2}$, as these nodes are being initially held low by the NMOS pair $M_{n1}/M_{n2}$. More specifically, as the input node IN goes down (as shown by waveform 251), the input node IN provides a source-gate voltage overdrive of $V_{sg,p1}=(V_{DDH}-V_{SSH})$ to the PMOS device 211 $M_{p1}$. Simultaneously, since the node $V_x$ starts at a $V_{DDL}$ level, the gate-source voltage overdrive of the NMOS device $M_{n1}$ is $V_{gs,n1}=(V_{DDL}-V_{SSL})$ Thus, two active devices having independent overdrive voltages are competing against each other. The competition between these two devices may have two possible outcomes:

If the input PMOS device 211 $M_{p1}$ having a voltage overdrive of $V_{sg,p1}=(V_{DDH}-V_{SSH})$ is stronger than the NMOS device $n_{n1}$ which has a voltage overdrive of $V_{gs,n1}=(V_{DDL}-V_{SSL})$, then the intermediate node $V_{n1}$ starts to rise towards $V_{DDR}$, leading to the intended behavior of the level-shifter circuit 130;

If the input PMOS device 211 $M_{p1}$ having a voltage overdrive of $V_{sg,p1}=(V_{DDH}-V_{SSH})$ is weaker than the NMOS device $M_{n1}$ which has a voltage overdrive of $V_{gs,n1}=(V_{DDL}-V_{SSL})$, then the intermediate node $V_{n1}$ is kept at $V_{SSL}$ level, which leads to an unintended behavior of the level-shifter circuit 130.

As can be observed in the two above-described scenarios, a major contributor to the device strength is its overdrive voltage. Since the higher supply domain (also referred to herein as the upper voltage domain) and the lower supply domain (also referred to herein as the lower voltage domain) are independent from each other, it may occur that the lower supply range is larger than the higher supply range, i.e. $(V_{DDL}-V_{SSL})>(V_{DDH}-V_{SSH})$. In such a case the overdrive voltage of the NMOS $M_{n1}$ device is larger than the overdrive voltage of the PMOS device 211 $M_{p1}$, which may lead to the above-mentioned unintended behavior of the level-shifter circuit 130.

Figure 2C:
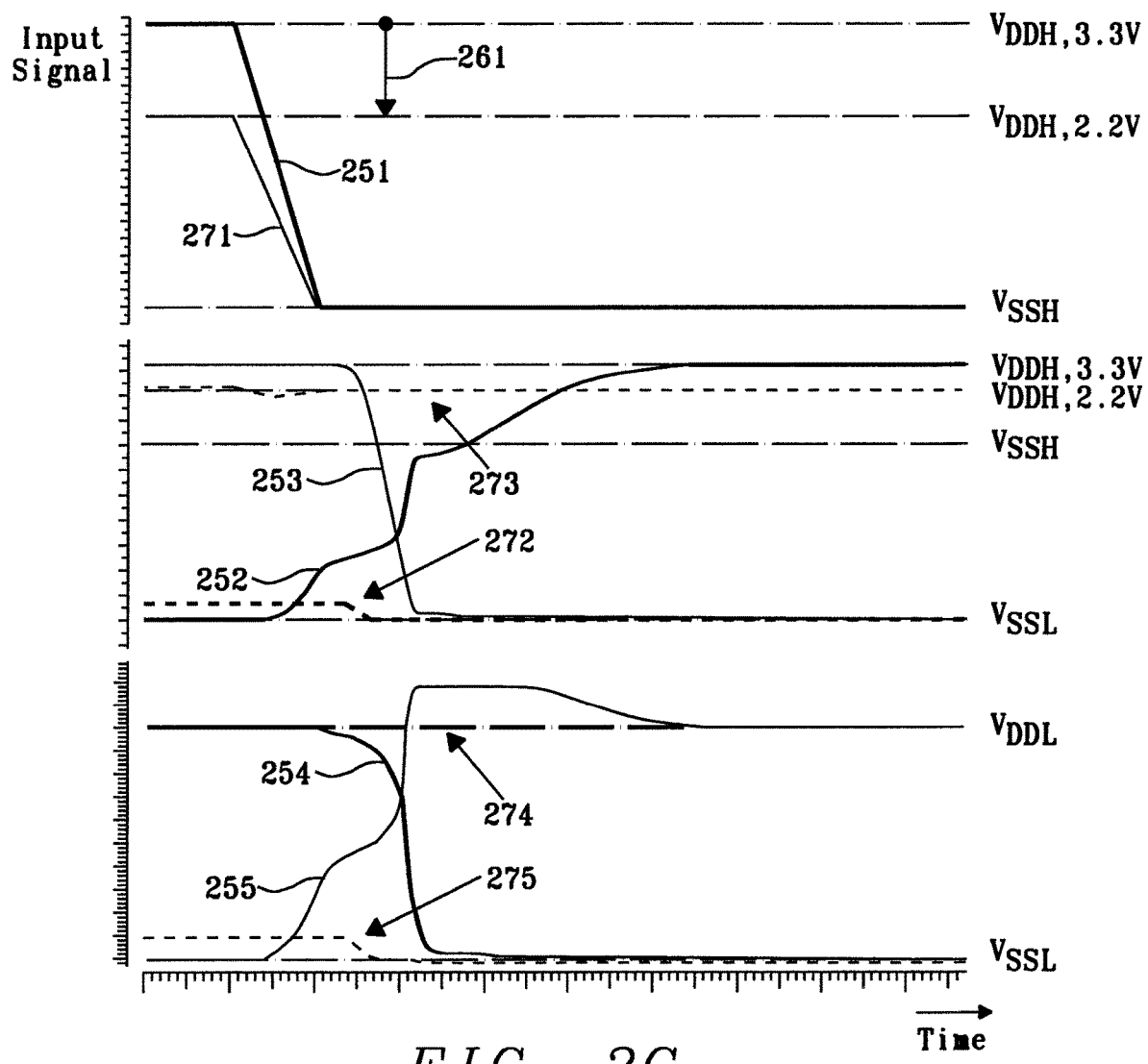
FIG. 2C illustrates example voltage signals of the level-shifter circuit in case of a reduced headroom of the input voltage.

FIG. 2C illustrates a situation where due to a reduced supply headroom 261 the PMOS input device $M_{p1}$ fails to control the intermediate node $V_{n1}$ which results in an unintended behavior of the level-shifter circuit 130. As the headroom 261 of the higher supply domain reduces from 3.3V down to 2.2V (waveform 271 vs. waveform 251), the overdrive voltage of the input PMOS device 211 $M_{p1}$ is reduced by the same amount. As a result of this, no transitioning occurs at the intermediate nodes $V_{n1}/V_{n2}$ (waveform 272 vs. 252, and waveform 273 vs. 253) or at the latch nodes $V_x/V_y$ (waveform 274 vs. 254, and waveform 275 vs. 255), resulting in a faulty operation of the level-shifter circuit 130. In particular, the level-shifter circuit 130 does not react to the change in logic state of the input control signal 131.

Figure 3A:
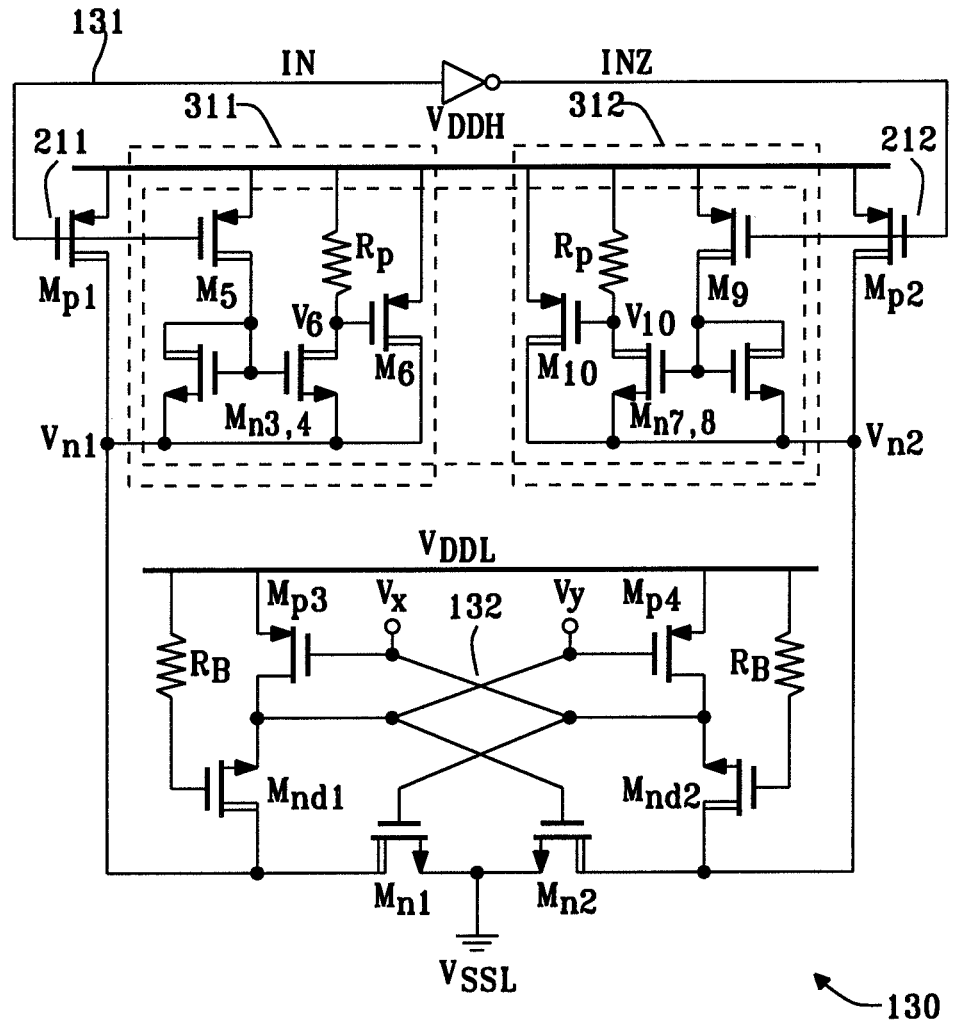
FIG. 3A shows a circuit diagram of an example level-shifter circuit comprising enhanced active pull-up circuits.

FIG. 3A shows a circuit diagram of an example level-shifter circuit 130 which ensures robust operation even in the presence of a relatively large supply range difference between the higher supply domain and the lower supply domain. Compared to the level-shifter circuit 130 of FIG. 2A, the level-shifter circuit 130 of FIG. 3A comprises additional circuitry 311, 312 which is directed at ensuring the pull-up of the intermediate nodes $V_{n1}/V_{n2}$, subject to a change of the logic state of the input signal 131. In particular, the additional components serve the following function:

the transistors $M_5$ and $M_9$ may be high-voltage PMOS type transistors. The gate terminal of these transistors receives the input signal 131 IN or the inverted input signal INZ, respectively; the source terminal of these transistors is connected to the supply voltage $V_{DDH}$, while the drain terminal of these transistors is connected to the gate-drain terminal of the transistors $M_{n3,4}$ or $M_{n7,8}$, respectively; the transistors $M_{n3,4}$ and $M_{n7,8}$ may be high-voltage NMOS type transistors. These devices each form an elemental current-mirror structure. Devices $M_{n3}$ and $M_{n7}$ are in diode-configuration having their gate-drain terminals shorted and connected to the drain of transistors $M_5$ and $M_9$, respectively. Devices $M_{n4}$ and $M_{n8}$ have their gate terminals shared with the gate-drain terminals of $M_{n3}$ and $M_{n7}$, respectively, while the drain terminals are driving the nodes $V_6$ and $V_{10}$, respectively. The source terminals of the devices $M_{n3,4}$ and $M_{n7,8}$ are connected to the corresponding intermediate nodes $V_{n1}$ and $V_{n2}$, respectively;

the transistors $M_6$ and $M_{10}$ may be high-voltage PMOS type transistors. The gate terminal is connected to the drain of $M_{n4}$ and $M_{n8}$, respectively, on one side, and to the supply $V_{DDH}$ through the resistor $R_P$, on the other side. The source terminal is connected to the supply $V_{DDH}$ while the drain terminal is connected to the corresponding intermediate nodes $V_{n1}$ and $V_{n2}$, respectively; and/or $R_P$ may be a pull-up resistor. The resistor is connected between the supply $V_{DDH}$ and the corresponding gate terminals of $M_6$ and $M_{10}$, respectively.

Figure 3B:
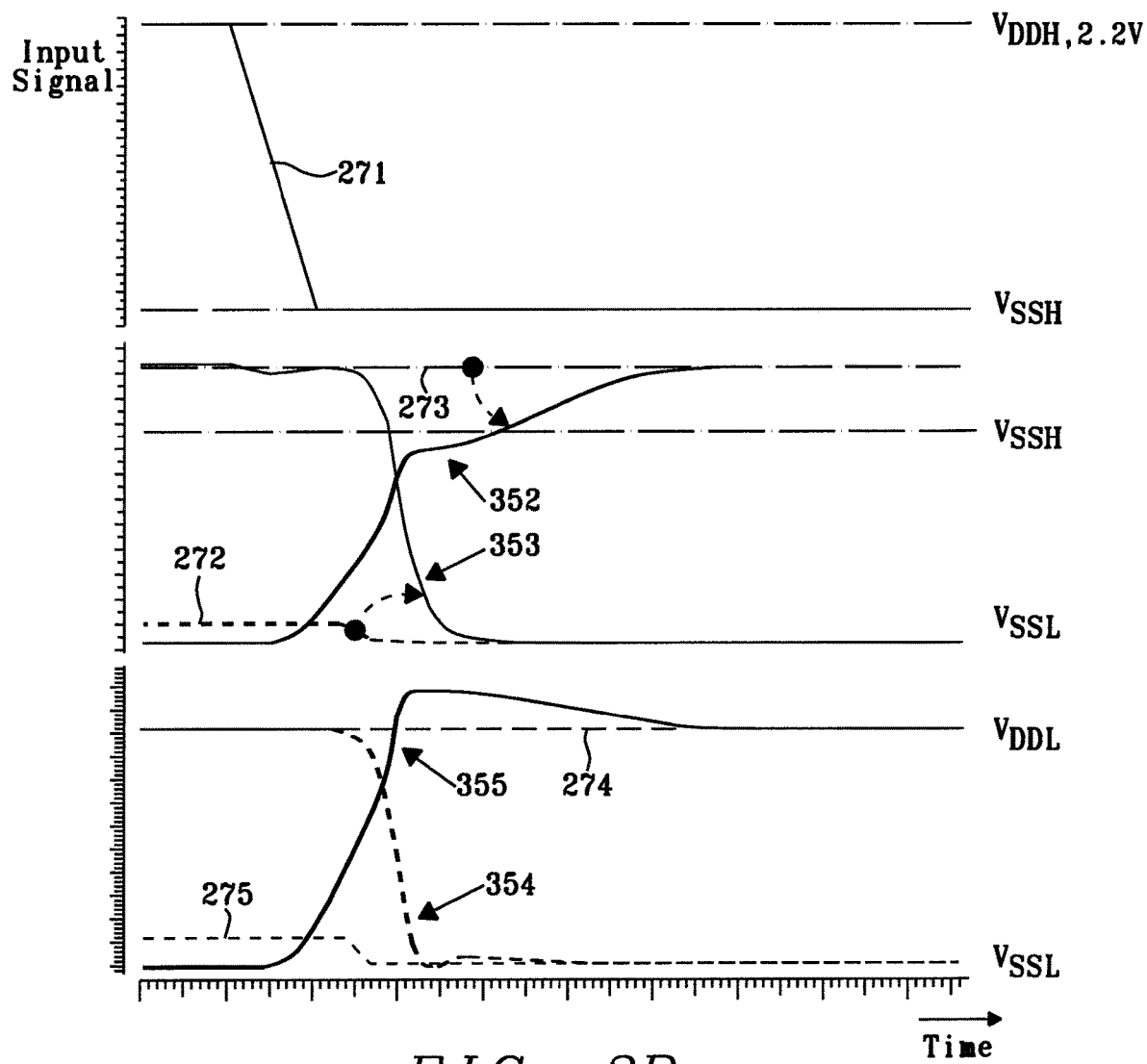
FIG. 3B illustrates example voltage signals subject to a change of the level of the input voltage of the level-shifter circuit of FIG. 3A.
Figure 3C:
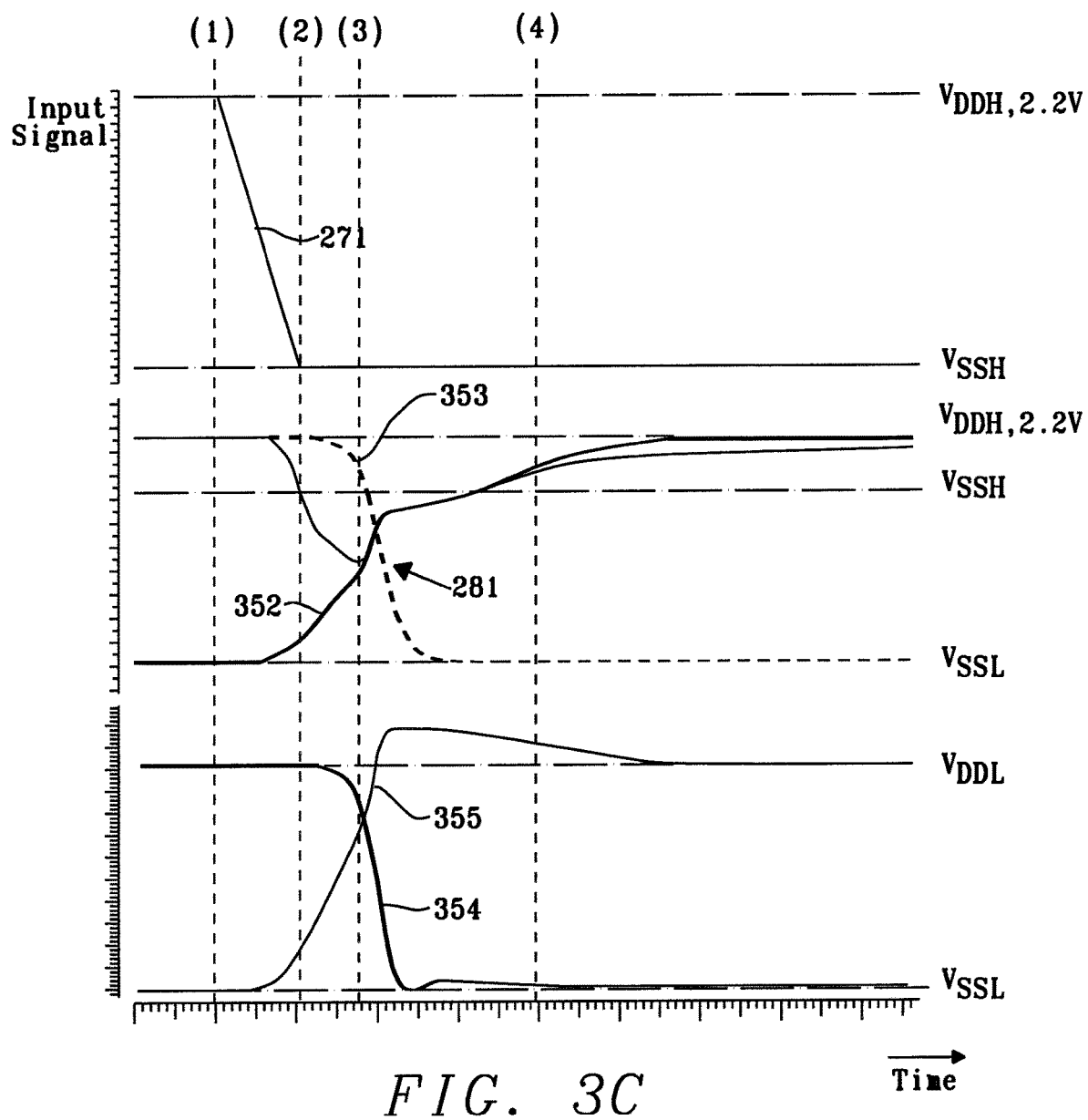
FIG. 3C illustrates example voltage signals subject to a change of the level of the input voltage of the level-shifter circuit of FIG. 3A.

FIGS. 3B and 3C illustrate operation of the level-shifter circuit 130 of FIG. 3A subject to a change in the logic state of the input signal 131 (the numbers referring to the numbers in FIG. 3C):

1. The transition cycle starts with the input signal 131 IN going down from $V_{DDH}$ to $V_{SSH}$ (waveform 271). In reaction to this, the device $M_5$ gets turned on to bias up the current-mirror structure $M_{n3,4}$;
2. As the current mirror structure $M_{n3,4}$ gets biased up, it ensures that the current is flowing through $M_{n4}$ effectively, thereby pulling down the node $V_6$ from $V_{DDH}$ to the level of the intermediate node $V_{n1}$ (as illustrated by the waveform 281 in FIG. 3C);
3. Pulling down of the node $V_6$ provides a relatively large source-gate overdrive to the device $M_6$ resulting in a relatively large current steering capability which ensures that the intermediate node $V_{n1}$ is brought up (waveform 352), thereby changing the logic-state of the level-shifter circuit 130;
4. When the intermediate node $V_{n1}$ reaches a voltage level which is higher than $V_{DDH}-V_{gs3,4}$, the current mirror structure $M_{n3,4}$ turns off due to the lack of headroom. Pull-up resistor $R_P$ ensures that the node $V_6$ is not left floating by providing a relatively weak DC path towards the supply voltage $V_{DDH}$.

Hence, when applying the same operating conditions as in FIG. 2B, it can be observed that the level-shifter circuit 130 is able to successfully propagate an input control signal 131 through different supply voltage domains and change its logic state at the output 132 as shown in FIG. 3B. Correct operation can be identified by observing the intermediate level-shifter nodes $V_{n1}$ and $V_{n2}$ and the output nodes of the latch structure (denoted as $V_x$ and $V_y$).

The level-shifter circuit 130 of FIG. 3A makes use of two parallel input paths which contribute to the pull-up of intermediate nodes $V_{n1}$ and $V_{n2}$, respectively. As shown in FIG. 3A, in addition to the input PMOS device 211 $M_{p1}$ which is controlled in the higher supply domain ($V_{DDH}-V_{SSH}$), there is also an input path through the PMOS device $M_{69}$ which leverages a relatively large voltage difference between the upper level of the higher supply range ($V_{DDH}$) and the lower level of the lower supply range ($V_{SSL}$). As a result, in active mode, the input PMOS device $M_{p1}$ has a voltage overdrive of $V_{sg,p1}=(V_{DDH}-V_{SSH})$, while the additional input PMOS device $M_6$ may have a larger voltage overdrive which is not limited by the higher supply range, thereby gaining a significantly larger current steering capability.

As can be seen in FIG. 3B, the intermediate node $V_{n1}$ is pulled up (waveform 352 vs. waveform 272), thereby causing the intermediate node $V_{n2}$ to go down (waveform 353 vs. waveform 273). This results in the output node $V_x$ to go down (waveform 354 vs. waveform 274) and the output node $V_y$ to go up (waveform 355 vs. waveform 275).

Figure 4:
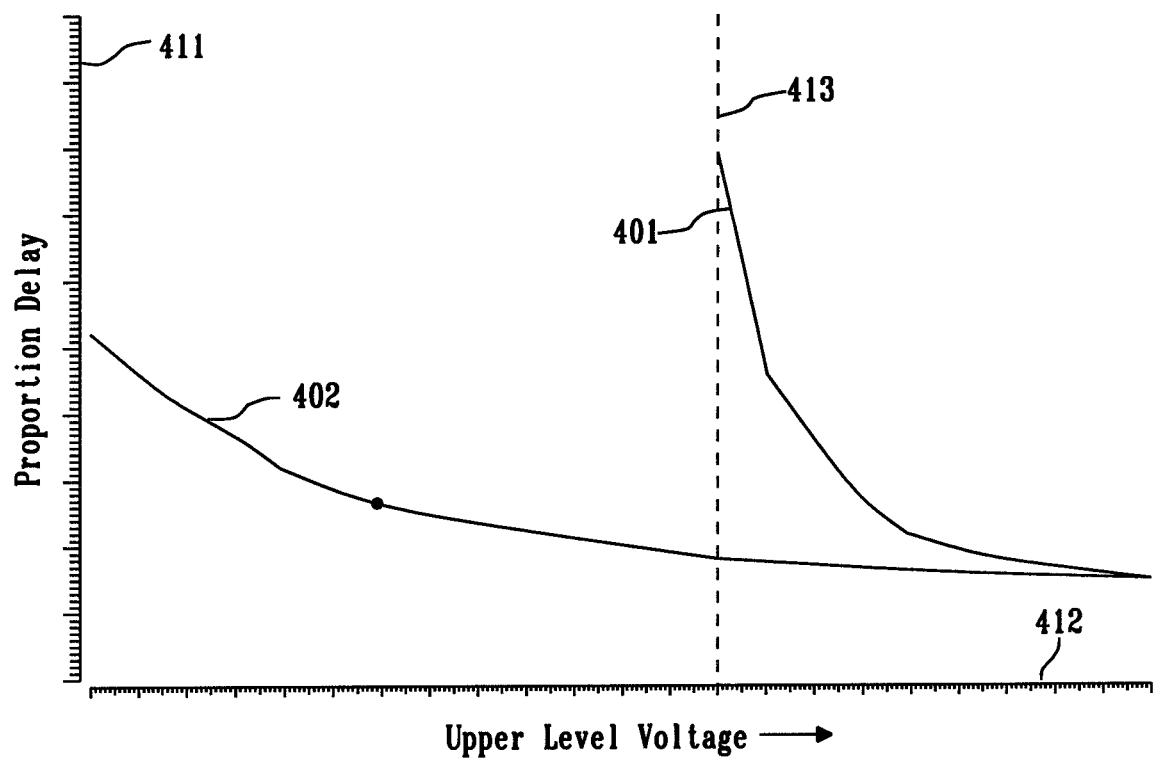
FIG. 4 illustrates example operational ranges for the input voltages for the level-shifter circuits of FIG. 2A and FIG. 3A.

FIG. 4 shows the propagation delay 411 of a level-shifter circuit 130 as a function of the upper level 412 $V_{DDH}$ of the higher supply domain (i.e., of the headroom of the higher supply domain). FIG. 4 shows the measurement curve 401 of the propagation delay 411 for the level-shifter circuit 130 of FIG. 2A and the measurement curve 402 of the propagation delay 411 for the level-shifter circuit 130 of FIG. 3A. It can be seen that if $V_{DDH}$ 412 drops below a certain threshold value 413, the level-shifter circuit 130 of FIG. 2A stops operating correctly, while the level-shifter circuit 130 of FIG. 3A still works correctly, thereby providing a level-shifter circuit 130 having an increased robustness. Furthermore, it can be seen that the level-shifter circuit 130 of FIG. 3A has a significantly lower propagation delay 411 than the level-shifter circuit 130 of FIG. 2A.

Figure 5A:
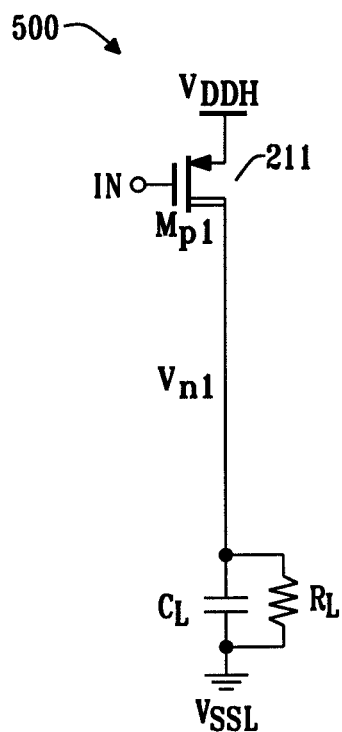
FIG. 5A shows a circuit diagram of an example active pull-up circuit.
Figure 5B:
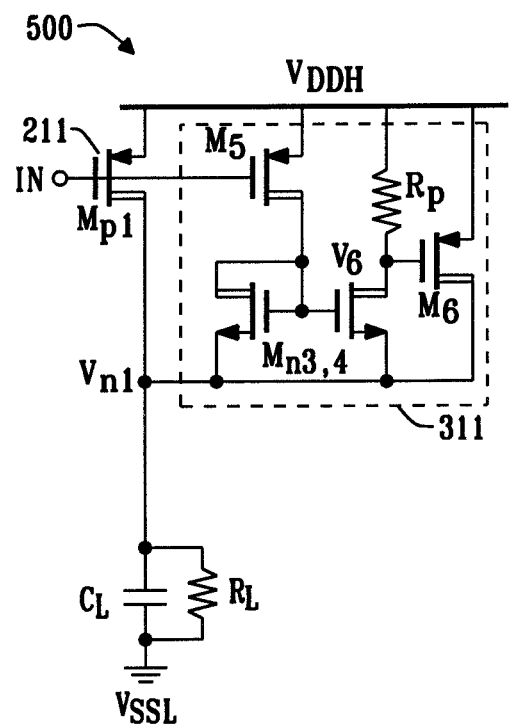
FIG. 5B shows a circuit diagram of an enhanced active pull-up circuit.

FIG. 5A shows a circuit diagram of the active pull-up circuit 500 of the level-shifter circuit 130 of FIG. 2A, and FIG. 5B shows a circuit diagram of the active pull-up circuit 500 of the level-shifter circuit 130 of FIG. 3A. The PMOS transistor 211 $M_{p1}$ acts as a switch. Once the input node IN goes down, the switch 211 turns ON and pulls the node $V_{n1}$ up. The load resistor $R_L$ opposes pulling up of the $V_{n1}$ node by trying to keep it at the $V_{SSL}$ level. The pull-up capability of the pull-up circuit 500 of FIG. 5A is defined by the equivalent on-resistance of the transistor 211 $M_{p1}$, which depends on the source-gate voltage overdrive at the transistor 211. The source-gate voltage is equivalent to the upper supply range ($V_{DDH}-V_{SSH}$) meaning that the pull-up capability of the circuit is reduced if the supply voltage $V_{DDH}$ is reduced.

On the other hand, the pull-up circuit 500 of FIG. 5B comprises two parallel pull-up branches 211, 311. As a result of this, the circuit 500 does not suffer from a degradation of the driving capability at a reduced supply voltage $V_{DDH}$, since the source-gate voltage overdrive of the pull-up FET $M_6$ is not limited to the upper supply range ($V_{DDH}-V_{SSH}$) as outlined above. Hence, a pull-up circuit 500 is shown in FIG. 5B, which provides a robust pull-up of the intermediate node $V_{n1}$, subject to a change of the logic state of the input signal 131 IN, even in a situation where the supply rage ($V_{DDH}-V_{SSH}$) is relatively narrow.

Hence, an active pull-up circuit 500 is described, which is operated between an upper voltage $V_{DDH}$ and a lower voltage $V_{SSL}$. The upper voltage $V_{DDH}$ may be the upper voltage $V_{DDH}$ of an input or upper voltage domain. The lower voltage $V_{SSL}$ may be the lower voltage $V_{SSL}$ of an output or lower voltage domain.

The pull-up circuit 500 may be configured to pull-up an intermediate node $V_{n1}$ of the pull-up circuit 500 to the upper voltage $V_{DDH}$ in reaction to the input voltage 131 IN of the pull-up circuit 500 falling from the upper voltage $V_{DDH}$ to an intermediate voltage $V_{SSH}$. The intermediate voltage $V_{SSH}$ may be the lower voltage $V_{SSH}$ of the input or higher voltage domain. Furthermore, the intermediate voltage $V_{SSH}$ typically lies between the upper voltage $V_{DDH}$ (of the input or higher voltage domain) and the lower voltage $V_{SSL}$ (of the output or lower voltage domain).

The pull-up circuit 500 comprises a first transistor 211 $M_{p1}$, e.g., a first P-type transistor, having a source terminal (directly) coupled to the upper voltage $V_{DDH}$ (of the input or higher voltage domain), a drain terminal (directly) coupled to the intermediate node $V_{n1}$ and a gate terminal (directly) coupled to the input voltage 131 IN. The first transistor 211 $M_{p1}$ may provide a first pull-up path of the pull-up circuit 500.

Furthermore, the pull-up circuit 500 typically comprises a load resistance $R_L$ coupling the intermediate node $V_{n1}$ (directly) to the lower voltage $V_{SSL}$ (of the output or lower voltage domain). The load resistance $R_L$ may be an effective resistance provided by one or more electronic components (e.g., transistors) of the pull-up circuit 500.

The pull-up circuit 500 further comprises a second transistor $M_6$, in particular a second P-type transistor, having a source terminal (directly) coupled to the upper voltage $V_{DDH}$ (of the input or higher voltage domain), a drain terminal (directly) coupled to the intermediate node $V_{n1}$ and a gate terminal (directly) coupled to a control node $V_6$. The second transistor $M_6$ may provide a second pull-up path of the pull-up circuit 500 (which is arranged in parallel to the first pull-up path). The control node $V_6$ may be coupled to the upper voltage $V_{DDH}$ (of the input or higher voltage domain) via a resistance $R_p$.

In addition, the pull-up circuit 500 comprises control circuitry 311 which is configured to pull the control node $V_6$ to the voltage level of the intermediate node $V_{n1}$, subject to the input voltage 131 IN falling from the upper voltage $V_{DDH}$ (of the input or higher voltage domain) to the intermediate voltage $V_{SSH}$ (which is typically the lower voltage $V_{SSH}$ of the input or higher voltage domain).

Hence, a pull-up circuit 500 with two parallel pull-up paths is described, thereby increasing the reliability and robustness of the pull-up circuit 500. The second pull-up path is controlled in dependence of the voltage level of the intermediate node $V_{n1}$, thereby rendering the control of the second pull-up path independent of the headroom of the input or higher voltage domain.

The control circuitry 311 may comprise a control transistor $M_5$ (e.g., a P-type transistor) which is configured to generate a control current through the control transistor $M_5$, subject to the input voltage 131 IN falling from the upper voltage $V_{DDH}$ to the intermediate voltage $V_{SSH}$. The control transistor $M_5$ may have a source terminal (directly) coupled to the upper voltage $V_{DDH}$, a drain terminal (directly) coupled to a diode-configured transistor of a current mirror $M_{n3,4}$ and a gate terminal (directly) coupled to the input voltage 131 IN.

Furthermore, the control circuitry 311 may comprise the current mirror $M_{n3,4}$ which is configured to mirror the control current (through the control transistor $M_5$) to the control node $V_6$. The current mirror $M_{n3,4}$ may comprise the diode-configured transistor and an output transistor, wherein the output transistor is arranged between the control node $V_6$ and the intermediate node $V_{n1}$. The diode-configured transistor and the output transistor may be N-type transistors. As a result of this, the second pull-up path may be controlled in a particularly reliable manner.

The control circuitry 311 may be configured such that subject to the input voltage 131 IN falling from the upper voltage $V_{DDH}$ to the intermediate voltage $V_{SSH}$, the output transistor of the current mirror $M_{n3,4}$ is closed, thereby coupling the control node $V_6$ to the intermediate node $V_{n1}$ (and thereby closing the second transistor $M_6$ for pulling up the voltage level of the intermediate node $V_{n1}$ to the upper voltage $V_{DDR}$).

Furthermore, a level-shifter circuit 130 is described, which is configured to translate a change of the (logic) level of an input voltage 131 IN within an input voltage domain ($V_{DDH}$–$V_{SSH}$) into a change of the level of an output signal 132 within an output voltage domain ($V_{DDL}$–$V_{SSL}$). The input voltage domain may exhibit an upper voltage $V_{DDH}$ (as an upper bound) and a lower voltage $V_{SSH}$ (as a lower bound). The output voltage domain may exhibit an upper voltage $V_{DDL}$ (as an upper bound) and a lower voltage $V_{SSL}$ (as a lower bound). The higher voltage $V_{DDL}$ of the output voltage domain may be equal to or lower than the lower voltage $V_{SSH}$ of the input voltage domain.

The level-shifter circuit 130 comprises a first pull-up circuit 500 as described in the present document (notably within the context of FIG. 5B). The first pull-up circuit 130 is operated between the upper voltage $V_{DDH}$ of the input voltage domain and the lower voltage $V_{SSL}$ of the output voltage domain.

Furthermore, the level-shifter circuit 130 comprises an output circuit operated between the upper voltage $V_{DDL}$ of the output voltage domain and the lower voltage $V_{SSL}$ of the output voltage domain. The output circuit may form the above-mentioned load resistance $R_L$ of the first pull-up circuit 500.

The first pull-up circuit 500 may be configured to pull-up the intermediate node $V_{n1}$ of the first pull-up circuit 500 to the upper voltage $V_{DDH}$ of the input voltage domain, subject to the input voltage 131 IN falling from the upper voltage $V_{DDH}$ of the input voltage domain to the lower voltage $V_{SSH}$ of the input voltage domain. Hence, subject to a change of the (logic) level of the input signal 131, the intermediate node $V_{n1}$ of the first pull-up circuit 500 may be pulled-up to the upper voltage $V_{DDH}$ of the input voltage domain.

Furthermore, the output circuit may be configured to change the level of the output signal 132 at an output node $V_x$, $V_y$ of the level-shifter circuit 130, subject to the intermediate node $V_{n1}$ of the first pull-up circuit 500 being pulled-up to the upper voltage $V_{DDH}$ of the input voltage domain. The change in the (logic) level of the output signal 132 at the output node $V_x$, $V_y$ may occur relative to the output voltage domain. In other words, the output signal 132 may vary between the upper voltage $V_{DDL}$ and the lower voltage $V_{SSL}$ of the output voltage domain.

The use of the active pull-up circuit 500 which is described in the present document ensures a reliable and robust pull-up of the intermediate node $V_{n1}$ (even in case of a relatively narrow input voltage domain), thereby ensuring a reliable change of the level of the output signal 132 (within the output voltage domain).

The output circuit may comprise a first output node $V_x$ and a second output node $V_y$ (which may provide a differential output of the level-shifter circuit 130). The output circuit may be configured to pull the level of the first output node $V_x$ down to the lower voltage $V_{SSL}$ of the output voltage domain and to pull the level of the second output node $V_y$ up to the higher voltage $V_{DDL}$ of the output voltage domain (or vice versa), subject to the intermediate node $V_{n1}$ of the first pull-up circuit 500 being pulled-up to the upper voltage $V_{DDH}$ of the input voltage domain, thereby providing a reliable level-shifting between the input and the output voltage domain.

The output circuit may comprise a first clamping transistor $M_{nd1}$ (e.g., a N-type transistor) having a drain terminal which is (directly) coupled to the intermediate node $V_{n1}$ of the first pull-up circuit 500, a source terminal (directly) coupled to the second output node $V_y$ and a gate terminal coupled to the higher voltage $V_{DDL}$ of the output voltage domain. The gate terminal of the first clamping transistor $M_{nd1}$ may be coupled to the higher voltage $V_{DDL}$ of the output voltage domain via a resistor $R_B$ (notably for noise reduction).

Furthermore, the output circuit may comprise a first latch transistor $M_{n1}$ (e.g., a N-type transistor) having a drain terminal (directly) coupled to the intermediate node $V_{n1}$ of the first pull-up circuit 500, a source terminal (directly) coupled to the lower voltage $V_{SSL}$ of the output voltage domain and a gate terminal (directly) coupled to the first output node $V_x$.

In addition, the output circuit may comprise a first auxiliary transistor $M_{p3}$ (e.g., a P-type transistor) having a drain terminal (directly) coupled to the source of the first clamping transistor $M_{nd1}$, a source terminal (directly) coupled to the higher voltage $V_{DDL}$ of the output voltage domain and a gate terminal (directly) coupled to the first output node $V_x$.

By providing the above-mentioned circuitry, a particularly reliable change in the level of the output signal 132 may be achieved.

The level-shifter circuit 130 may comprise a second pull-up circuit 500 as described in the present document. The second pull-up circuit 500 may be operated between the upper voltage $V_{DDH}$ of the input voltage domain and the lower voltage $V_{SSL}$ of the output voltage domain. The second pull-up circuit 500 may be configured to pull-up the intermediate node $V_{n2}$ of the second pull-up circuit 130 to the upper voltage $V_{DDH}$ of the input voltage domain, subject to the inverted version INZ of the input voltage 131 IN falling from the upper voltage $V_{DDH}$ of the input voltage domain to the lower voltage $V_{SSH}$ of the input voltage domain.

By providing a second pull-up circuit 500 which is controlled based on the inverted version INZ of the input voltage 131 IN, reliable and robust level-shifting may be performed for changes of the logic level of the input voltage 131 from HIGH to LOW and from LOW to HIGH.

The output circuit may comprise a second clamping transistor $M_{nd2}$ (e.g., a N-type transistor) having a drain terminal (directly) coupled to the intermediate node $V_{n2}$ of the second pull-up circuit 500, a source terminal (directly) coupled to the first output node $V_x$ and a gate terminal coupled to the higher voltage $V_{DDL}$ of the output voltage domain. The gate terminal of the second clamping transistor $M_{nd2}$ may be coupled to the higher voltage $V_{DDL}$ of the output voltage domain via a resistor $R_B$ (notably for noise reduction).

Furthermore, the output circuit may comprise a second latch transistor $M_{n2}$ (e.g., a N-type transistor) having a drain terminal (directly) coupled to the intermediate node $V_{n2}$ of the second pull-up circuit 500, a source terminal (directly) coupled to the lower voltage $V_{SSL}$ of the output voltage domain and a gate terminal (directly) coupled to the second output node $V_y$.

In addition, the output circuit may comprise a second auxiliary transistor $M_{pa}$ (e.g., a P-type transistor) having a drain terminal (directly) coupled to the source of the second clamping transistor $M_{nd2}$, a source terminal (directly) coupled to the higher voltage $V_{DDL}$ of the output voltage domain and a gate terminal (directly) coupled to the second output node $V_y$.

By providing the above-mentioned circuitry, a particularly reliable bi-directional change in the level of the output signal 132 may be achieved.

In addition, a switched power converter 100 configured to derive a second voltage 102 based on a first voltage 101 is described. The first voltage 101 and the second voltage 102 may have opposite polarity. In particular, the second voltage 102 may be a negative voltage derived based on a positive first voltage 101 (or vice versa).

The power converter 100 comprises a first power switch 111 (e.g., a P-type transistor) which is (directly) coupled to the first voltage 101. Furthermore, the power converter 100 comprises a first driver circuit 121 configured to control the first power switch 111 based on a lower voltage $V_{SSH}$ and a higher voltage $V_{DDH}$ of a higher voltage domain.

In addition, the power converter 100 comprises a second power switch 112 (e.g., a N-type transistor) which is (directly) coupled to the second voltage 102. The power converter 100 further comprises a second driver circuit 122 configured to control the second power switch 112 based on a lower voltage $V_{SSL}$ and a higher voltage $V_{DDL}$ of a lower voltage domain.

The first power switch 111 and the second power switch 112 may be arranged in series between the first voltage 101 and the second voltage 102. Furthermore, the first power switch 111 and the second power switch 112 may be (directly) coupled via a switch node SW. In addition, the power converter 100 may comprise an inductance 113 arranged between the switch node SW and a reference potential (e.g., ground).

The first power switch 111 and the second power switch 112 may be closed and/or opened in a mutually exclusive manner. For this purpose, the first power switch 111 and/or the first driver circuit 121 may be controlled in dependence of a first control signal 131, and the second power switch 112 and/or the second driver circuit 122 may be controlled in dependence of a second control signal 132, wherein the logic level or logic state of the first and the second control signals 131, 132 are typically opposed to one another (i.e., when the first control signal 131 is HIGH, the second control signal 132 is LOW; and/or vice versa).

The power converter 100 comprises a level-shifter circuit 130 as described in the present document, wherein the level-shifter circuit 130 is configured to determine the second control signal 132 for controlling the second power switch 112 (within the lower voltage domain) based on the first control signal 131 for controlling the first power switch 111 (within the higher voltage domain).

By making use of the level-shifter circuit 130 described in the present document, a particular reliable and robust operation of the power converter 100 may be achieved.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An active pull-up circuit which is operated between an upper voltage and a lower voltage and which is configured to pull-up an intermediate node to the upper voltage in reaction to an input voltage of the pull-up circuit falling from the upper voltage to an intermediate voltage; wherein the intermediate voltage lies between the upper voltage and the lower voltage; wherein the pull-up circuit comprises,
   a first transistor having a source terminal coupled to the upper voltage, a drain terminal coupled to the intermediate node and a gate terminal coupled to the input voltage;
   a load resistance coupling the intermediate node to the lower voltage;
   a second transistor having a source terminal coupled to the upper voltage, a drain terminal coupled to the intermediate node and a gate terminal coupled to a control node; and
   control circuitry configured to pull the control node to a voltage level of the intermediate node, subject to the input voltage falling from the upper voltage to the intermediate voltage.

2. The active pull-up circuit of claim 1, wherein the control circuitry comprises
   a control transistor configured to generate a control current through the control transistor subject to the input voltage falling from the upper voltage to the intermediate voltage; and
   a current mirror configured to mirror the control current to the control node.

3. The active pull-up circuit of claim 1, wherein the control circuitry comprises
   a control transistor having a source terminal coupled to the upper voltage, a drain terminal coupled to a diode-configured transistor of a current mirror and a gate terminal coupled to the input voltage;
   the current mirror which comprises the diode-configured transistor and an output transistor; wherein the output transistor is arranged between the control node and the intermediate node.

4. The active pull-up circuit of claim 3, wherein the control circuitry is configured such that subject to the input voltage falling from the upper voltage to the intermediate voltage ($V_{SSH}$), the output transistor of the current mirror is closed, thereby coupling the control node ($V_6$) to the intermediate node.

5. The active pull-up circuit of claim 1, wherein
   the first transistor is a P-type transistor; and/or
   the second transistor is a P-type transistor.

6. A level-shifter circuit configured to translate a change of a level of an input voltage within an input voltage domain into a change of a level of an output signal within an output voltage domain; wherein
   the level-shifter circuit comprises a first pull-up circuit according to claim 1;
   the first pull-up circuit is operated between an upper voltage of the input voltage domain and a lower voltage of the output voltage domain;
   the level-shifter circuit comprises an output circuit operated between an upper voltage of the output voltage domain and the lower voltage of the output voltage domain;
   the output circuit forms the load resistance of the first pull-up circuit;
   the first pull-up circuit is configured to pull-up the intermediate node of the first pull-up circuit to the upper voltage of the input voltage domain, subject to the input voltage falling from the upper voltage of the input voltage domain to a lower voltage of the input voltage domain; and
   the output circuit is configured to change a level of the output signal at an output node of the level-shifter circuit, subject to the intermediate node of the first pull-up circuit being pulled-up to the upper voltage of the input voltage domain.

7. The level-shifter circuit of claim 6, wherein the output circuit comprises
   a first output node and a second output node; and
   the output circuit is configured to pull the level of the first output node down to the lower voltage of the output voltage domain and to pull the level of the second output node up to the higher voltage of the output voltage domain, subject to the intermediate node of the first pull-up circuit being pulled-up to the upper voltage of the input voltage domain.

8. The level-shifter circuit of claim 7, wherein the output circuit comprises
   a first clamping transistor having a drain terminal coupled to the intermediate node of the first pull-up circuit, a source terminal coupled to the second output node and a gate terminal coupled to the higher voltage of the output voltage domain;
   a first latch transistor having a drain terminal coupled to the intermediate node of the first pull-up circuit, a source terminal coupled to the lower voltage of the output voltage domain and a gate terminal coupled to the first output node; and
   a first auxiliary transistor having a drain terminal coupled to the source of the first clamping transistor, a source terminal coupled to the higher voltage of the output voltage domain and a gate terminal coupled to the first output node.

9. The level-shifter circuit of claim 6, wherein the higher voltage of the output voltage domain is equal to or lower than the lower voltage of the input voltage domain.

10. A switched power converter configured to derive a second voltage based on a first voltage; wherein the power converter comprises
    a first power switch coupled to the first voltage, and a first driver circuit configured to control the first power switch based on a lower voltage and a higher voltage of a higher voltage domain;
    a second power switch coupled to the second voltage, and a second driver circuit configured to control the second power switch based on a lower voltage and a higher voltage of a lower voltage domain; and
    a level-shifter circuit according to claim 6, configured to determine a second control signal for controlling the second power switch based on a first control signal for controlling the first power switch.

11. The switched power converter according to claim 10, wherein the first voltage and the second voltage have opposite polarity.

12. The switched power converter according to claim 10, wherein
    the first power switch and the second power switch are arranged in series between the first voltage and the second voltage;
    the first power switch and the second power switch are coupled via a switch node; and
    the power converter comprises an inductance arranged between the switch node and a reference potential.

13. The level-shifter circuit of claim 6, wherein
the level-shifter circuit comprises a second pull-up circuit according to claim 1;
the second pull-up circuit is operated between the upper voltage of the input voltage domain and the lower voltage of the output voltage domain; and
the second pull-up circuit is configured to pull-up the intermediate node of the second pull-up circuit to the upper voltage of the input voltage domain, subject to an inverted version of the input voltage falling from the upper voltage of the input voltage domain to the lower voltage of the input voltage domain.

14. The level-shifter circuit of claim 13 referring back to claim 8, wherein the output circuit comprises
a second clamping transistor having a drain terminal coupled to the intermediate node of the second pull-up circuit, a source terminal coupled to the first output node and a gate terminal coupled to the higher voltage of the output voltage domain;
a second latch transistor having a drain terminal coupled to the intermediate node of the second pull-up circuit, a source terminal coupled to the lower voltage of the output voltage domain and a gate terminal coupled to the second output node; and
a second auxiliary transistor having a drain terminal coupled to the source of the second clamping transistor, a source terminal coupled to the higher voltage of the output voltage domain and a gate terminal coupled to the second output node.

15. The level-shifter circuit of claim 14, wherein the gate terminal of the first and second clamping transistors are each coupled to the higher voltage of the output voltage domain via respective resistors.

* * * * *